US007733256B2

(12) United States Patent
Yamauchi

(10) Patent No.: US 7,733,256 B2
(45) Date of Patent: Jun. 8, 2010

(54) ANALOG SIGNAL GENERATOR

(75) Inventor: Shigeki Yamauchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 101 days.

(21) Appl. No.: 12/206,084

(22) Filed: Sep. 8, 2008

(65) Prior Publication Data

US 2009/0073022 A1 Mar. 19, 2009

(30) Foreign Application Priority Data

Sep. 18, 2007 (JP) ............................ 2007-241497

(51) Int. Cl.
*H03M 1/66* (2006.01)

(52) U.S. Cl. ...................................... 341/144; 341/155

(58) Field of Classification Search .......... 341/144–155
See application file for complete search history.

(56) References Cited

U.S. PATENT DOCUMENTS 6,462,692 B1 10/2002 Moriya
6,603,883 B1 * 8/2003 Hamanaka .................. 382/239
6,980,667 B2 * 12/2005 Hamanaka .................. 382/239
7,102,545 B2 * 9/2006 Choi ........................... 341/56
2007/0139225 A1 * 6/2007 Lee ............................. 341/22

* cited by examiner

*Primary Examiner*—Lam T Mai
(74) *Attorney, Agent, or Firm*—Volentine & Whitt, PLLC

(57) ABSTRACT

The present invention provides an analog signal generator capable of simultaneously improving both items of the influence of noise on a peripheral circuit and the settling time for a desired voltage level. A D/A converter to which the analog signal generator is applied, is configured as follows. A controller supplies a fixed value to data generation units, which respectively generate data according to clock signals and output the same to a buffer unit. The buffer unit temporarily holds the data therein. Control signals generated from the controller are supplied to a selection unit or selector, which decodes the control signals and thereby generates selection signals to turn ON/OFF the output of the data held in the buffer unit in response to the selection signals, after which the corresponding data is supplied to a filter unit, where an analog signal is generated based on the data supplied to the filter unit.

5 Claims, 10 Drawing Sheets

SCHEMATIC CONFIGURATION EXAMPLE OF D/A CONVERTER

SCHEMATIC CONFIGURATION EXAMPLE OF D/A CONVERTER

TIMING CHART

CONFIGURATION EXAMPLE OF SELECTOR

TIMING CHART

ANOTHER CONFIGURATION EXAMPLE OF DATA GENERATION UNIT

TIMING CHART

FURTHER CONFIGURATION EXAMPLE OF DATA GENERATION UNIT

Fig. 9

RELATIONSHIP OF OUTPUT VALUES AT PATH GENERATION UNIT

| OUTPUT OF COUNTER [4:0] COUNTER [DEC] (128) | OUTPUT OF COUNTER [4:0] COUNTER [BIN] (128) | 4 BITS OF COMPARATOR COUNTER [3:0] (130) | DATA 46 : COMP1 (132) |
|---|---|---|---|
| 0 | 00000 | 0 | 1 |
| 3 | 00011 | 3 | 1 |
| 6 | 00110 | 6 | 0 |
| 9 | 01001 | 9 | 0 |
| 12 | 01100 | 12 | 0 |
| 15 | 01111 | 15 | 0 |
| 18 | 10010 | 2 | 1 |
| 21 | 10101 | 5 | 0 |
| 24 | 11000 | 8 | 0 |
| 27 | 11011 | 11 | 0 |
| 30 | 11110 | 14 | 0 |
| 1 | 00001 | 1 | 1 |
| 4 | 00100 | 4 | 0 |
| 7 | 00111 | 7 | 0 |
| 10 | 01010 | 2 | 1 |
| 13 | 01101 | 5 | 0 |
| 16 | 10000 | 0 | 1 |
| 19 | 10011 | 3 | 1 |
| 22 | 10100 | 6 | 0 |
| 25 | 11001 | 9 | 0 |
| 28 | 11100 | 12 | 0 |
| 31 | 11111 | 15 | 0 |
| 2 | 00010 | 2 | 1 |
| 5 | 00101 | 5 | 0 |
| 8 | 01000 | 8 | 0 |
| 11 | 01011 | 11 | 0 |
| 14 | 01110 | 14 | 0 |
| 17 | 10001 | 1 | 1 |
| 20 | 10100 | 4 | 0 |
| 23 | 10111 | 7 | 0 |
| 26 | 11010 | 10 | 0 |
| 29 | 11101 | 13 | 0 |
| 0 | 00000 | 0 | 1 |
| 3 | 00011 | 3 | 1 |

TIMING CHART

ANALOG SIGNAL GENERATOR

BACKGROUND OF THE INVENTION

The present invention relates to an analog signal generator, and is applied particularly to a digital/analog converter circuit, an AGC (Automatic Gain Controller) and the like.

Heretofore, a variable AMP (AMPlifier) circuit and a tuning circuit have respectively been equipped with a variable capacitive element, so-called varicap and make use of a combined circuit of a DAC (Digital-to-Analog Converter) circuit and an analog filter, and a combined circuit of a PWM (Pulse-Width Modulation) circuit and an analog filter. The varicap is supplied with a bias control signal. In the above built-in combinational circuits, the use of either of the DAC circuit and the PWM circuit has been selected depending on used applications.

When it is desired to cause a variation in bias level to converge earlier and reduce the influence of noise on a peripheral circuit, the DAC circuit has been selected. When the variation in the bias level may be slow or it is not necessary to strictly consider the influence of the noise on the peripheral circuit, the PWM circuit has been selected.

In the case of the former condition, however, the choice of the DAC circuit rather than the choice of the PWM circuit is most suitable as described above. When, however, the DAC circuit is mounted inside a chip of an IC (Integrated Circuit), i.e., a semiconductor element, the DAC circuit entails a demerit in that it is large in chip area as compared with the PWM circuit and current consumption becomes great.

In the case of the latter condition, it is feared that when it is desired to cause the variation in bias level to converge earlier, i.e., shorten the settling time using the conventional PWM circuit, noise will influence the peripheral circuit in the conventional PWM circuit. This is because in view of the mechanism of the PWM circuit, noise is considered to be caused by harmonic components contained in each pulse. The more the speed of each pulse increases, the more there is a fear of the influence of noise thereon. When the conventional PWM circuit is used in this way, the PWM circuit needs to take into consideration a trade-off between relaxation of the influence of noise on the peripheral circuit and the shortening of the settling time at which a desired voltage level is reached.

SUMMARY OF THE INVENTION

The present invention aims to solve the drawbacks of such a prior art and provide an analog signal generator capable of simultaneously improving both items of the influence of noise on a peripheral circuit and the settling time for a desired voltage level.

In order to solve the above problems, the present invention provides an analog signal generator comprising first data generating means for generating data within a predetermined cycle according to a first clock signal supplied thereto, second data generating means for generating data within a variable cycle according to a second clock signal supplied thereto, switching means for temporarily holding the data outputted from the first and second data generating means and switching ON/OFF of the output of the data held therein, selecting means for decoding control signals supplied thereto, generating selection signals for performing switching of ON/OFF and outputting the same to the switching means, control means for supplying a predetermined value to the first and second data generating means, generating the control signals for the selecting means and supplying the same to the selecting means, and analog generating means for generating an analog signal by filtering, based on the data supplied via the switching means.

According to the analog signal generator of the present invention, the control means supplies a predetermined value to the first and second data generating means, which respectively generate data according to the first and second clock signals and output the same to the switching means. The switching means temporarily holds the data outputted from the first and second data generating means. The control means supplies control signals generated thereat to the selecting means. The selecting means decodes the control signals supplied thereto and thereby generates selection signals. The selecting means turns ON/OFF the output of the data held in the switching means in response to the selection signals, after which the corresponding data is supplied to the analog generating means, where an analog signal is generated based on the data supplied thereto, whereby the data is outputted according to the switching. Thus, it is possible to provide an analog signal which is caused to reach a desired voltage level and reduces even the influence of noise exerted on a peripheral circuit. This is because since the first data generating means can make high the randomness for data generation as compared with the data generation of the conventional PWM circuit, data "0" and "1" are more dispersed and thereby data is generated. Therefore, the analog signal generator is capable of making high an analog cutoff frequency and causing an analog output to converge on a desired DC (Direct Current) level earlier. The analog signal generator can also increase a clock speed for the first data generating means and allows an analog output to converge on a desired DC level.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 is a diagram illustrating examples of both count values handled by the data generation unit (PDM) shown in FIG. 9 and output data from a comparator.

DETAILED DESCRIPTION OF THE PREFERRED EMBODIMENTS

Preferred embodiments of the present invention will hereinafter be described with reference to the accompanying drawings.

First Preferred Embodiment

Figure 1:
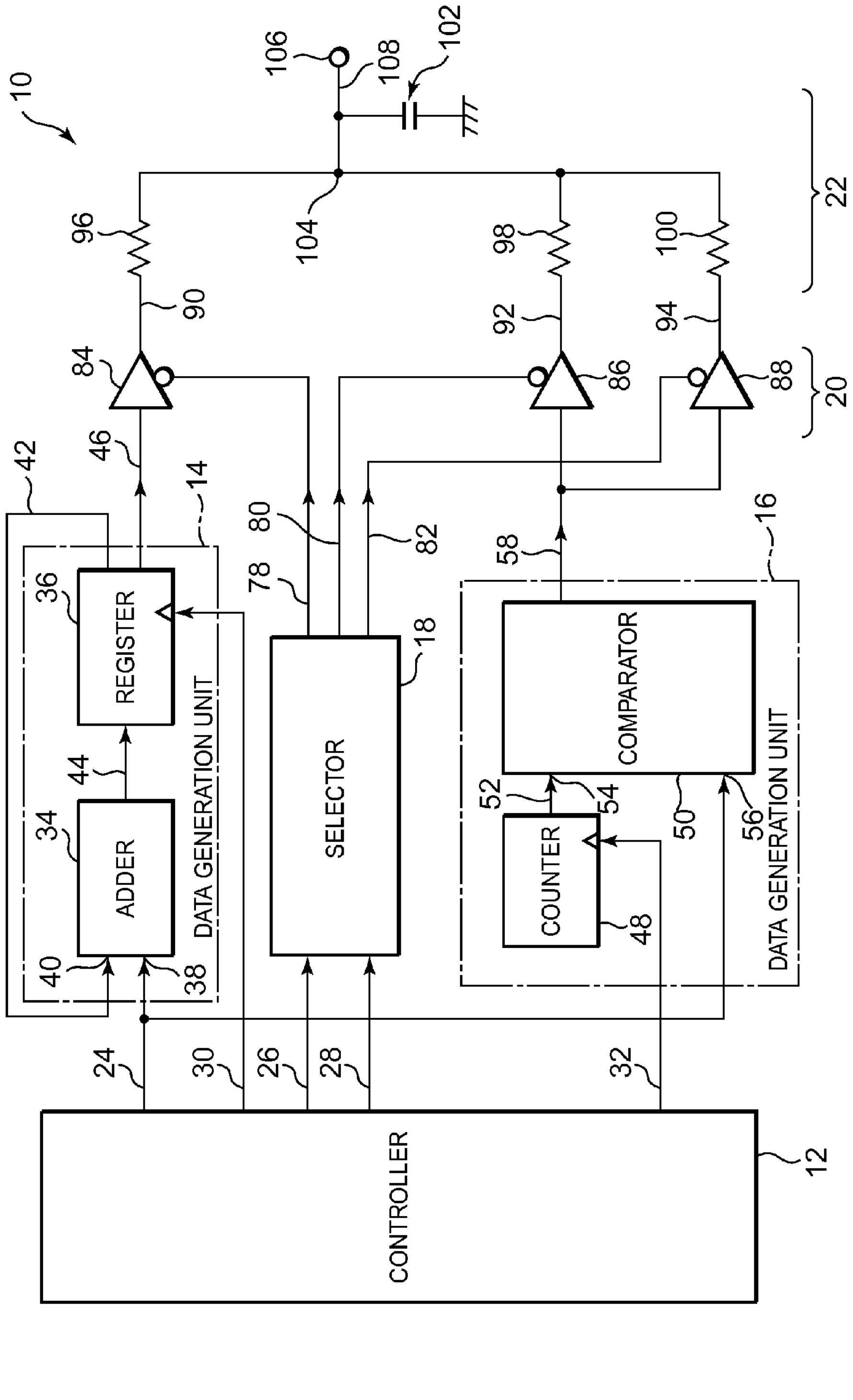
FIG. 1 is a block diagram showing a schematic configuration of a D/A converter to which an analog signal generator according to the present invention is applied.

A first preferred embodiment of an analog signal 0generator according to the present invention will next be described in detail with reference to the accompanying drawings. Referring to FIG. 1, the preset embodiment illustrative of the analog signal generator according to the present invention is configured as follows: A controller 12 supplies a fixed value 24 to data generation units 14 and 16, which respectively generate data 46 and 58 according to clock signals 30 and 32 and output the same to a buffer unit 20. The buffer unit 20 temporarily holds the data 46 and 58 therein. Control signals 26 and 28 generated from the controller 12 are supplied to a selection unit or selector 18, which decodes the control signals 26 and 28 and thereby generates selection signals 78, 80 and 82 to turn ON/OFF the outputs of the data 46 and 58 held in the buffer unit 20 in response to the selection signals 78, 80 and 82, after which the corresponding data is supplied to a filter unit 22, where an analog signal 108 is generated based on the data supplied to the filter unit 22. Thus, since the data can be outputted according to the above switching, an analog signal can be provided which is allowed to reach a desired voltage level and also reduces the influence of noise on a peripheral circuit.

The present embodiment illustrates a case in which the analog signal generator of the present invention is applied to a D/A converter 10. Illustrations and explanations of components directly irrelevant to the present invention will be omitted. In the following description, signals are designated at reference numerals for connecting lines illustrated in the description.

As shown in FIG. 1, the D/A converter 10 includes the controller 12, data generation units 14 and 16, selector 18, buffer unit 20 and filter unit 22. The controller 12 has a fixed value transmitting or sending function, a buffer selecting function and a clock signal generating function at the generation of data. The controller 12 generates bits representing a fixed value 24 (FIX_DATA) used to generate data, in the form of "1" and "0" with predetermined timing and supplies the generated fixed value 24 to the data generation units 14 and 16.

Here, the fixed value (FIX_DATA) is of a target value which indicates a desired target voltage level. Thus, when the voltage level of the analog signal is kept unchanged, the voltage of an analog signal generated at each stage becomes constant.

The controller 12 outputs control signals 26 and 28 for selecting one buffer from the buffer unit 20 to the selector 18. The outputted control signals are determined depending on the number of buffers provided therein. Since the three buffers are provided in the present embodiment, the number of control signals may be two. The controller 12 generates clock signals 30 and 32 according to the clock signal generating function and supplies the clock signals 30 and 32 to the data generation units 14 and 16.

The data generation unit 14 has the function of generating data for PDM (Pulse Density Modulation). The PDM is indicative of density modulation of each pulse contained in a predetermined cycle. The data generation unit 14 includes an adder 34 and a register 36. The adder 34 inputs the fixed value 24 on the one end 38 side thereof and inputs an output signal 42 of the register 36 on the other end 40 side thereof. The adder 34 outputs a result of addition 44 of the inputted fixed value 24 and output signal 42 to the register 36. The register 36 has the function of holding the output of the adder 34. The register 36 updates or renews the result of addition 44 of the adder 34 for every rise pulse of the clock signal 30 (CLK1) supplied thereto. If it is descried in Verilog-HDL (Hardware Description Language), then the data generation unit 14 outputs data 46 (A[X]: Xbit-th data) and an output signal 42 ([(X−1): 0]A) generated based on the following equation (1) using an X-bit register:

```
[X:0]A REGISTER={1'B0,FIX_DATA}+{1'B0,A
    REGISTER[(X−1):0];                              (1)
```

The data 46 (A[X]) is supplied to the buffer unit 20. The output signal 42 ([(X−1): 0]A) is supplied to the adder 34.

Figure 2:
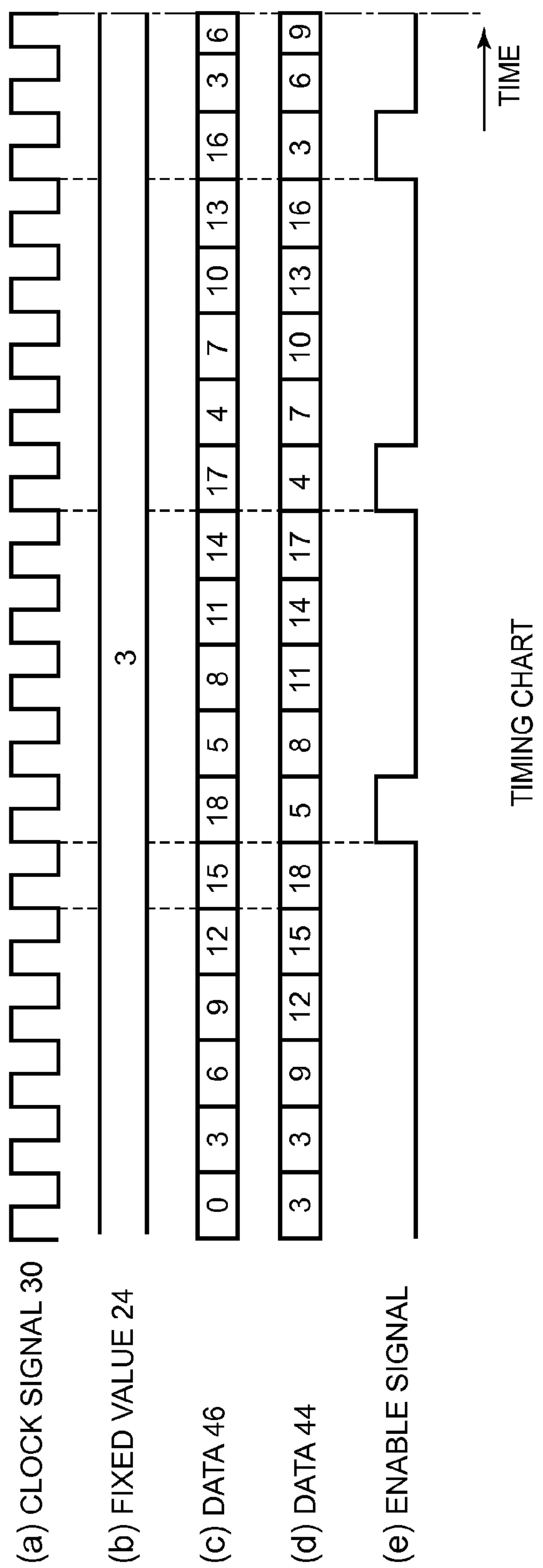
FIG. 2 is a timing chart which has disclosed the operation of a data generation unit (PDM) shown in FIG. 1.

This operation example is shown by a timing chart illustrated in FIG. 2. The data generation unit 14 of FIG. 2 corresponds to the case in which X=4. The data generation unit 14 supplies a clock signal 30 shown in FIG. 2(*a*) to the register 36. The adder 34 is supplied with a fixed value 24 of "3" shown in FIG. 2(*b*) and outputs data 44 shown in FIG. 2(*d*) to the register 36. The register 36 inputs the data 44 therein and outputs data 46 shown in FIG. 2(*c*) therefrom in sync with the rising edge of the clock signal 30. An enable signal shown in FIG. 2(*e*) is a selection signal 78 supplied to a buffer 84 to be described later. The buffer 84 outputs the data 46 as data stored during a level "H" of the enable signal.

Referring back to FIG. 1, the data generation unit 16 has the function of generating data for PWM (Pulse Width Modulation). The PWM indicates the modulation of a pulse width in a variable cycle. The data generation unit 16 includes a counter 48 and a comparator 50. The counter 48 is of an (X−1) bit counter, which counts up on the rising edge of the clock signal 32 and is reset in a predetermined number of bits.

```
COUNTER1 = COUNTER + 1;                    (2)
IF(COUNTER1 = 2^X−1) COUNTER1 = 0;
```

The counter 48 outputs an output 52 (COUNTER1) thereof to the one end 54 side of the comparator 50. At the comparator 50, the other end 56 side thereof is supplied with the fixed value 24 (FIX_DATA) corresponding to a desired target voltage level value. Thus, when the voltage level of the analog signal is kept unchanged, the voltage level becomes a constant value.

The comparator 50 compares whether the output 52 (COUNTER1) of the counter is less than or equal to the fixed value 24 (FIX_DATA). The comparator 50 outputs data 58 (COMP=1) to the buffer unit 20 when the following is shown:

```
IF(COUNTER1 <= FIX_DATA)      COMP = 1;      (3)
ELSE                          COMP = 0;
```

that is, when the result of comparison is true. When the result of comparison is false, the comparator 50 outputs data 58 (COMP=0) to the buffer unit 20.

Figure 3:
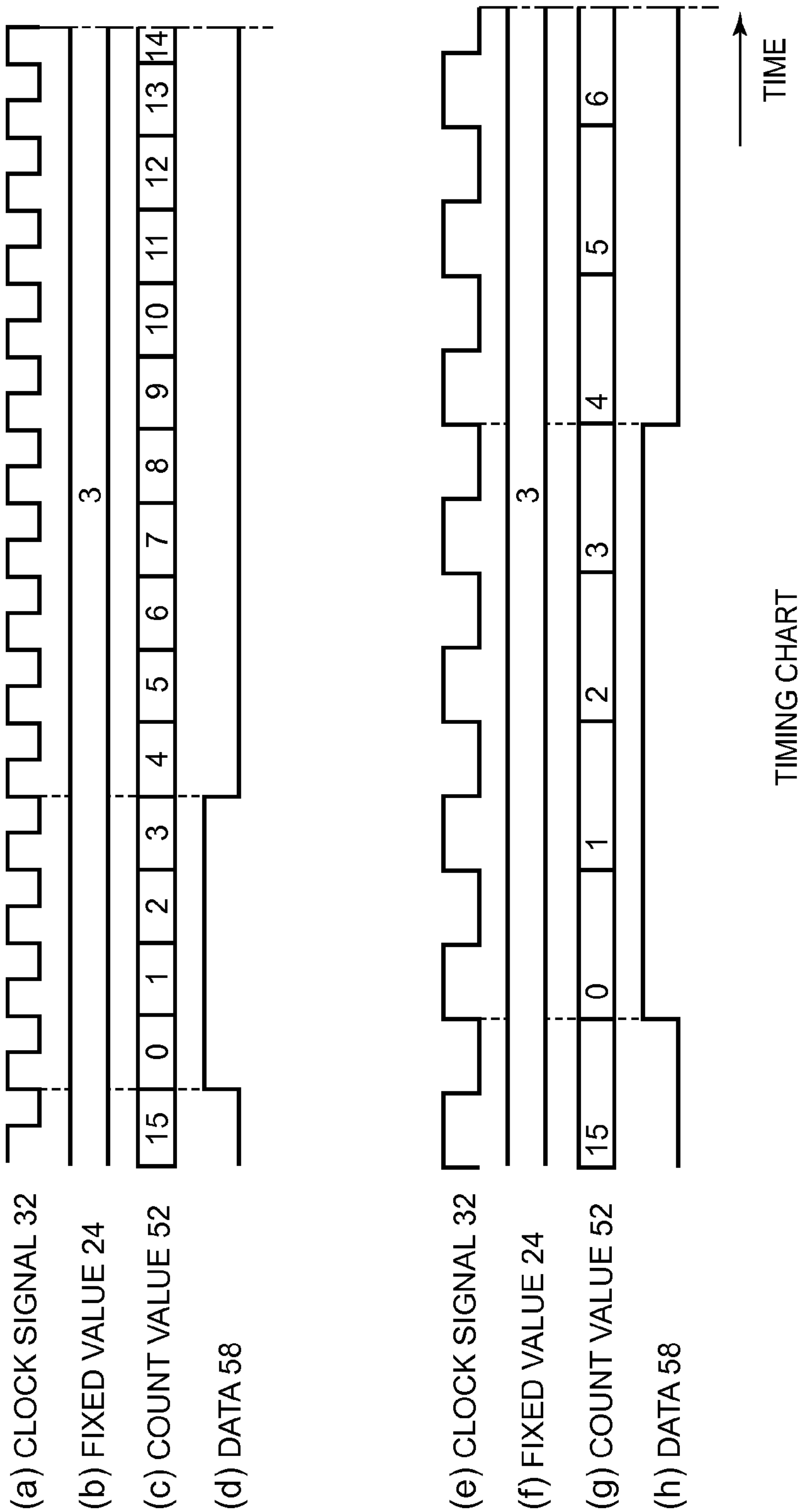
FIG. 3 is a timing chart which has disclosed the operation of a data generation unit (PWM) shown in FIG. 1.

This operation example is shown by a timing chart of FIG. 3. The data generation unit 16 in FIG. 3 also corresponds to the case in which X=4. The data generation unit 16 supplies a clock signal 32 shown in FIG. 3(*a*) to the counter 48. The comparator 50 is supplied with a fixed value 24 of "3" shown in FIG. 3(*b*) and a count value 52 shown in FIG. 3(*c*). The comparator 50 outputs data 58 shown in FIG. 3(*d*) to the buffer 86.

At the output of a third buffer to be described later, timings shown in FIGS. 3(*e*) through 3(*h*) are equivalent to those obtained by substantially slowing down the speed of the clock signal 32 with respect to the operation of a second buffer. The controller 12 may output the low-speed clock signal 32 according to the switching of the selector 18.

Figure 4:
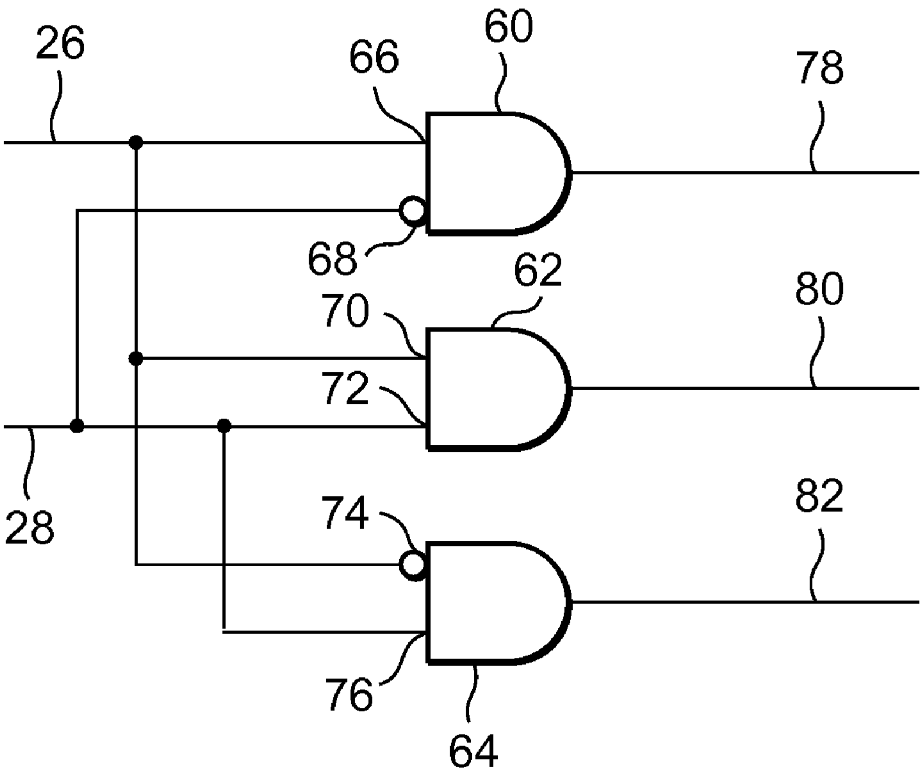
FIG. 4 is a block showing a schematic configuration of a selection unit shown in FIG. 1.

The selector 18 has the function of selecting a signal outputted from the buffer unit 20 in response to control signals 26 and 28 supplied from the controller 12. Described specifically, the selector 18 includes three two-input AND circuits 60, 62 and 64 as shown in FIG. 4. The AND circuit 60 inputs the control signal 26 on the non-inversion terminal 66 side and inputs the control signal 28 on the inversion terminal 68 side. The AND circuit 62 inputs the control signals 26 and 28 at terminals 70 and 72 respectively. The AND circuit 64 inputs the control signal 26 on the inversion terminal 74 side and inputs the control signal 28 on the non-inversion terminal 76 side. The two-input AND circuits 60, 62 and 64 respectively input the supplied control signals 26 and 28 and output selection signals 78, 80 and 82 to the buffer unit 20 as output signals based on AND operations thereof according to these inputs.

Referring back to FIG. 1, the buffer unit 20 has the function of buffering supplied data and outputting the same according to the selection. The buffer unit 20 employed in the present embodiment includes three tri-state buffers 84, 86 and 88. The tri-state buffer 84 is supplied with the data 46. The tri-state buffers 86 and 88 are respectively supplied with the data 58. When the tri-state buffers 84, 86 and 88 are active low and the selection signals 78, 80 and 82 are of a level "H" respectively, the buffers are operated (EN1=1; BUFFER A=A REGISTER[X]; EN1=0; BUFFER A=Z). The buffers 86 and 88 input/output the supplied data 58 according to an enable state (EN1=1; BUFFER B=COMP; EN2=0; BUFFER B=Z).

The tri-state buffers 84, 86 and 88 respectively output buffer outputs 90, 92 and 94 to the filter unit 22 in response to the selection signals 78, 80 and 82.

The filter unit 22 has the function of performing a filtering process on the supplied signals. In the present embodiment, the filter unit 22 includes resistors 96, 98 and 100 and a capacitor 102. The resistors 96, 98 and 100 in the filter unit 22 are connected to their corresponding output ends of the tri-state buffers 84, 86 and 88. The resistors 96, 98 and 100 are parallel-connected in common at the other end 104. The capacitor 102 also has one end connected in parallel to the other end 104 and the other end grounded. The filter unit 22 forms filters having three different time constants by combinations of the resistor 96 and capacitor 102, the resistor 98 and capacitor 102, and the resistor 100 and capacitor 102. The filter unit 22 outputs an analog signal 108 from an output terminal 106 through one filter that passes a signal outputted according to the selection by the buffer unit 20.

Incidentally, the filter unit 22 may be provided with buffers at points where output ends of capacitors and resistors are respectively connected in parallel, to control the operations of the buffers according to the control signals supplied from the controller 12. Thus, the type of filter can be increased a few times than the capacitor at the filter unit 22.

As to an output signal 108 (Y) from the output terminal 106, the level subsequent to CR filtering of the analog unit 22 becomes (Vcc/2^(X−1))*(FIX_DATA) assuming that an I/O source voltage is of a voltage Vcc.

The operation of the D/A converter 10 will next be described. When it is desired to cause the voltage level of the analog output signal to reach a desired level earlier, the time constant $\tau$ (CR) at the analog unit 22 may preferably be reduced at the D/A converter 10. In the D/A converter 10 shown in FIG. 1, the resistors 96, 98 and 100 are set so as to increase in resistance value in this order. Thus, since the time constant is expressed by the product of the capacitance C and the resistance value R, the analog filters of the analog unit 22 are placed in a relationship in which the time constant becomes large in the order in which the resistance value increases. According to another viewpoint, the order in which the buffers 84, 86 and 88 output can be mentioned as the order in which the settling times at which the desired voltage level is reached are short.

When frequency spectrums are viewed at the same time intervals at the three buffer outputs 90, 92 and 94 employed in the present embodiment even though the D/A converter 10 outputs the same analog signal level, the spread of the frequency spectrums becomes narrower in the output order of the buffers 84, 86 and 88.

The D/A converter 10 according to the present embodiment is operated according to the difference in time constant. Upon an initial operation for changing the voltage level, the D/A converter 10 outputs an analog signal, based on the output of the buffer 84. The controller 12 multiplies the value of the difference between the fixed value 24, i.e., pre-change FIX_DATA value and a post-change FIX_DATA value by a variable timer parameter value for the buffer 84 being held in the controller 12 to generate a waiting time. The controller supplies control signals 26 and 28 generated based on the arithmetic operation in this way to the selector 18. The selector 18 outputs a selection signal 78 for bringing the buffer 84 to a high impedance state to the buffer 84 after a waiting time therefor has elapsed from its enable state. During this period, the buffers 86 and are respectively supplied with selection signals 80 and 82 for bringing them to a high impedance state and placed in an output stop state.

After the waiting time for the buffer 84 has elapsed, the buffer 84 is brought to an output stop. The selector brings the selection signal 80 to an enable state to set the buffer 86 to an output state. At this time, the buffers 84 and 88 are respectively at an output stop.

The controller 12 has a variable timer parameter value for the buffer 86 and generates a waiting time by an arithmetic operation similar to that for the buffer 84. The controller 12 supplies the control signals 26 and 28 generated based on the arithmetic operation in this way to the selector 18. After the waiting time for the buffer has elapsed, the selector 18 outputs the selection signal 80 for bringing the buffer 86 to a high impedance state to the buffer 86. Thus, the buffer 86 is brought to an output stop.

Thereafter, the controller 12 deactivates the buffers 84 and 86 and enables the output of the buffer 88. The controller 12 has a variable timer parameter value for the buffer 88 and generates a waiting time by an arithmetic operation similar to that for the waiting time of the buffer 84. The controller 12 supplies the control signals 26 and 28 generated based on the arithmetic operation in this way to the buffer 88. The selector 18 supplies the selection signal 82 for enabling only the buffer 88 to the buffer 88 and supplies the selection signals 78 and 80 for disabling the buffers 84 and 88 to the buffers 84 and 86.

When the voltage of the analog signal is changed again after the waiting time for the buffer 88 has elapsed, the controller 12 supplies the control signals 26 and 28 to the selector 18 in such a manner that the corresponding signal is outputted from the buffer 84. The selector 18 outputs the selection signals 78, 80 and 82 for enabling the output of the buffer 84 and stopping the output operations of the buffers 86 and 88 to the buffer 20.

Figure 5:
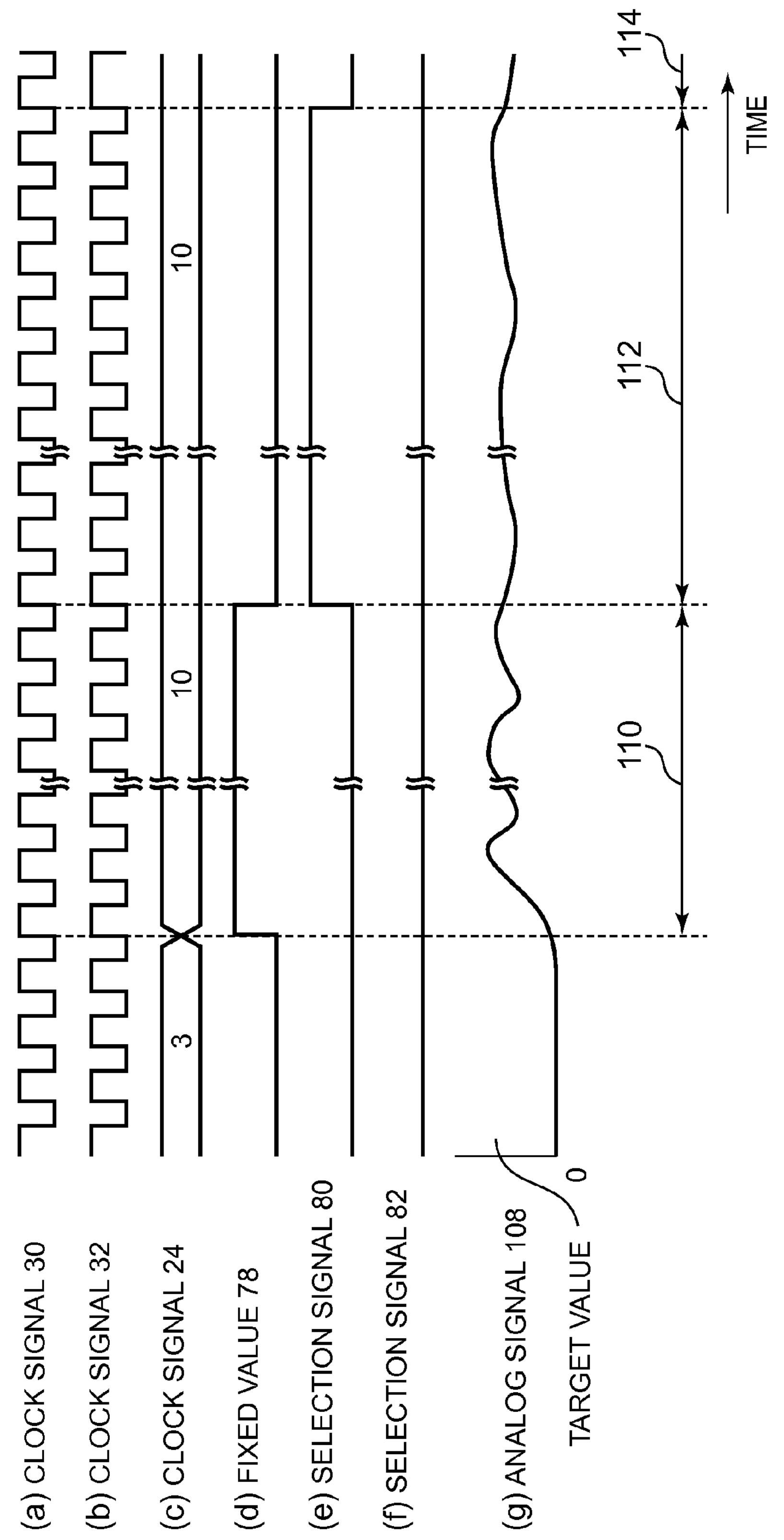
FIG. 5 is a timing chart which has disclosed the operation of the D/A converter shown in FIG. 1.

A specific timing chart of the D/A converter 10 is shown in FIG. 5. In this timing chart, a fixed value 24 (FIX_DATA value) shown in FIG. 5(*c*) is changed from "3" to "10" depending on clock signals 30 and 32 shown in FIGS. 5(*a*) and 5(*b*). When selection signals 78, 80 and 82 shown in FIGS. 5(*d*) through 5(*f*) are respectively of a level "H", the D/A converter 10 outputs an analog signal 108 shown in FIG. 5(*g*). When the selection signals 78, 80 and 82 are respectively of a level "L", the buffers 84, 86 and 88 are respectively brought into a high impedance state, so that only one buffer is selected and brought to an output state.

Since a desired target level is reached earlier, the D/A converter 10 first operates the data generation unit 14 and supplies data 46 from the data generation unit 14 to the buffer 84. The buffer 84 outputs an analog signal 108 over a period 110. In this case, the influence of noise on each peripheral circuit increases due to the influence of the data 46 outputted from the data generation unit 14, and the ripple of the analog signal 108 becomes large.

After the waiting time, i.e., the period 110 has elapsed, the D/A converter 10 supplies the data 58 to the buffer 86. The buffer 86 outputs the analog signal 108 over a period 112.

Thereafter, the D/A converter 10 changes the cycle of the clock signal shown in FIG. 5(*b*) after the waiting time, i.e., the period 112 generated by the controller 12. Thus, the D/A converter 10 supplies the data 58 to the buffer 88 in a state of having activated the data generation unit 16. The buffer 88 output the analog signal 108 over a period 114.

As is apparent from the operation of the data generation unit 16, the D/A converter 10 reduces the influence of noise on the peripheral circuit due to the influence of each pulse by extending the pulse cycle of the data 58 and reduces the ripple of the analog signal 108 by increasing the time constant.

With such a configuration, the settling time at which the desired voltage level is reached can be made earlier upon the initial operation. Further, when the desired voltage level is reached, it is possible to change the operation of generating data and reduce the influence of noise exerted on the peripheral circuit. Therefore, an advantageous effect can be brought about in that the level characteristic equivalent to that for the D/A converter can be obtained while a small circuit scale is provided.

As compared with the case in which the D/A converter is operated based on the output of the buffer 84 to the output of the buffer 88, the ripple level of the analog signal is allowed to converge earlier by outputting the analog signal in the order of the buffers 84, 86 and 88.

Further, the processing method of the data generation unit 14 is capable of setting a small time constant because "1" of the pulse signal is not outputted continuously, i.e., "1" is more dispersed. Thus, it is possible to cause the voltage level to reach the desired voltage level earlier.

Incidentally, there has been shown the case in which the controller 12 operates the buffers 84, 86 and 88 in that order. When, however, the immediately-preceding set analog target value and its updated analog target value remain almost unchanged, the two generation units for the buffers 86 and 88 may be controlled only by the buffer 88 or the generation units may be controlled only by the buffer 88 depending on the amount of change in the target value.

Second Preferred Embodiment

Figure 6:
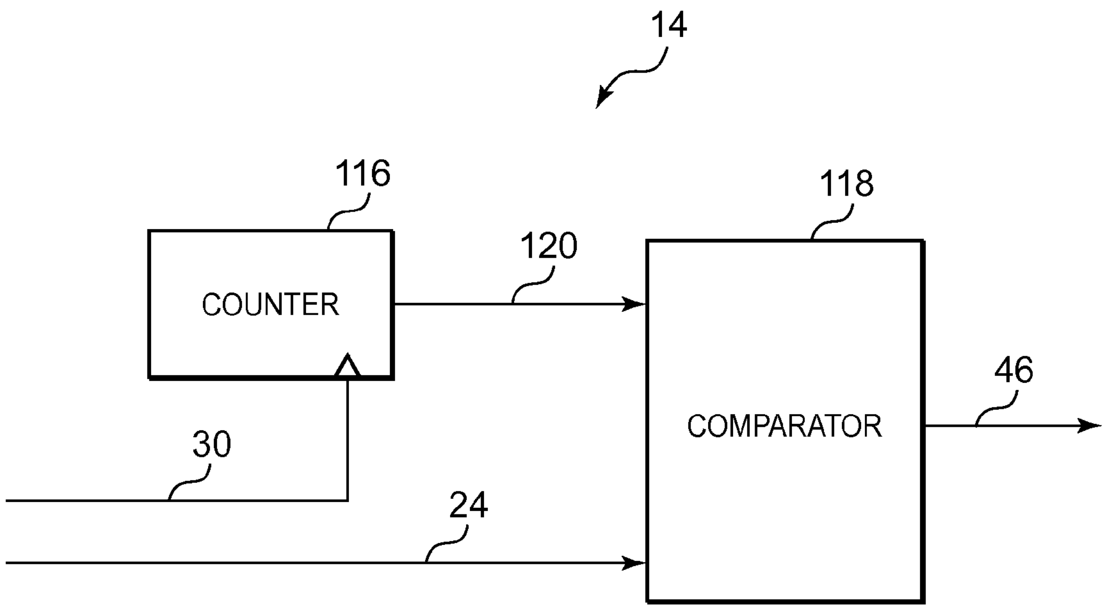
FIG. 6 is a block diagram showing a schematic configuration of another configuration example illustrative of the data generation unit (PDM) shown in FIG. 1.

A second preferred embodiment illustrative of a D/A converter 10 to which an analog signal generator according to the present invention is applied will next be explained. In a data generation unit 14 of the present embodiment, a PDM function is realized by a counter 116 and a comparator 118 as shown in FIG. 6. Constituent elements or components employed in the present embodiment are merely different from the above in terms of the components of the data generation unit 14.

The counter 116 operates as expressed in the following equation (4). A counter value 120 is incremented one by one every rise pulse of a clock signal 30 (COUNTER1=COUNTER1+1). When the counter value 120 is maximum, the counter value 120 is reset to zero (IF (COUNTER1=2^X−1) COUNTER1=0).

The comparator 118 compares between values obtained by exchanging values obtained by exchanging the positions of all bits of the counter value 120 (COUNTER1) symmetrically with respect to the bit center, values obtained by exchanging MSB (Most Significant Bit) and LSB (Least Significant Bit) thereof symmetrically with respect thereto, and a fixed value 24 ([(X−1):0]FIX_DATA).

| | | |
|---|---|---|
| IF(COUNTER1[0: (X−1)]) <= FIX_DATA) | COMP1 = 1; | (4) |
| ELSE | COMP1 = 0; | |

that is, when the values obtained by exchanging the positions of all bits of the counter value 120 symmetrically with respect to the bit center are less than or equal to the fixed value 24, the comparator 118 outputs data 46 of a level "H" (COMP=1) to a buffer 84 in accordance with the above conditional expression (4). When the values obtained by exchanging MSB and LSB of the counter value 120 symmetrically with respect to the bit center are greater than the fixed value 24 in reverse, the comparator 118 outputs a level "L" (COMP=0) to the buffer 84. The buffer 84 outputs the data 46 as data supplied during a level "H" period of an enable signal and stops its output during a level "L" period of the enable signal (EN1=1; BUFFER A=COMP1; EN1=0; BUFFER A=Z).

Figure 7:
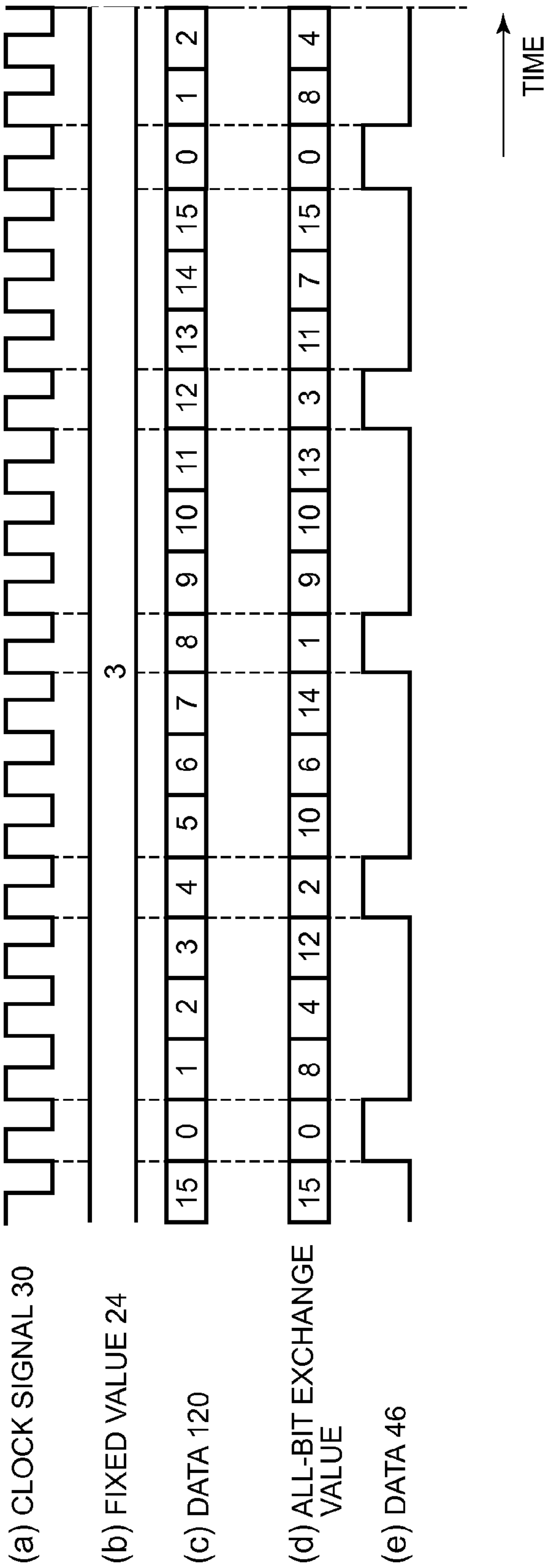
FIG. 7 is a timing chart which has disclosed the operation of the data generation unit (PDM) shown in FIG. 6.

The D/A converter 10 according to the present embodiment is equal to one of the previous embodiment in terms of the operation of an analog signal. A point of difference between the present embodiment and the previous embodiment is only the data generation unit 14 as described above. The operation of the data generation unit 14 will be explained in brief by referring to FIG. 7. The counter 16 inputs a clock signal 30 shown in FIG. 7(*a*). As the fixed value 24, for example, "3" is supplied as shown in FIG. 7(*b*). The counter 116 is of a 4-bit counter and outputs a count value 120 to the comparator 118 as shown in FIG. 7(*c*).

The comparator 118 has the function of generating an all-bit exchange value of the supplied count value 120 and the function of comparing them. That is, as the former function, the all-bit exchange value becomes "12" (1100) when the count value 120 is of "3" (0011), for example. The comparator 118 compares the two by the latter function. Thus, since the all-bit exchange value is greater than the fixed value, the comparator 118 outputs "0" as data 46 as shown in FIG. 7(*e*). When the next count value 120 is of "4" (0100), the all-bit exchange value becomes "2" (0010). Since the all-bit exchange value is not greater than the fixed value, the comparator 118 outputs "1" as the data 46 as shown in FIG. 7(*e*).

Since the data generation unit 14 of the present embodiment is also capable of preventing "1" of the pulse signal from being outputted continuously, i.e., of more dispersing "1" in a manner similar to the data generation unit 14 of the previous embodiment, a small time constant can be set. Thus, it is possible to cause the voltage level to reach a desired voltage level earlier. With the dispersion of the data "1" in this way, a frequency component can be made high, and the time constant of a filter with respect to a buffer output 90 outputted from the buffer 84 can be set to a smaller time constant.

Since the data "1" can be more dispersed, such a processing method of data generation unit 14 is capable of setting the time constant of the filter to a smaller time constant and causing the voltage to reach a desired voltage level earlier.

Third Preferred Embodiment

Figure 8:
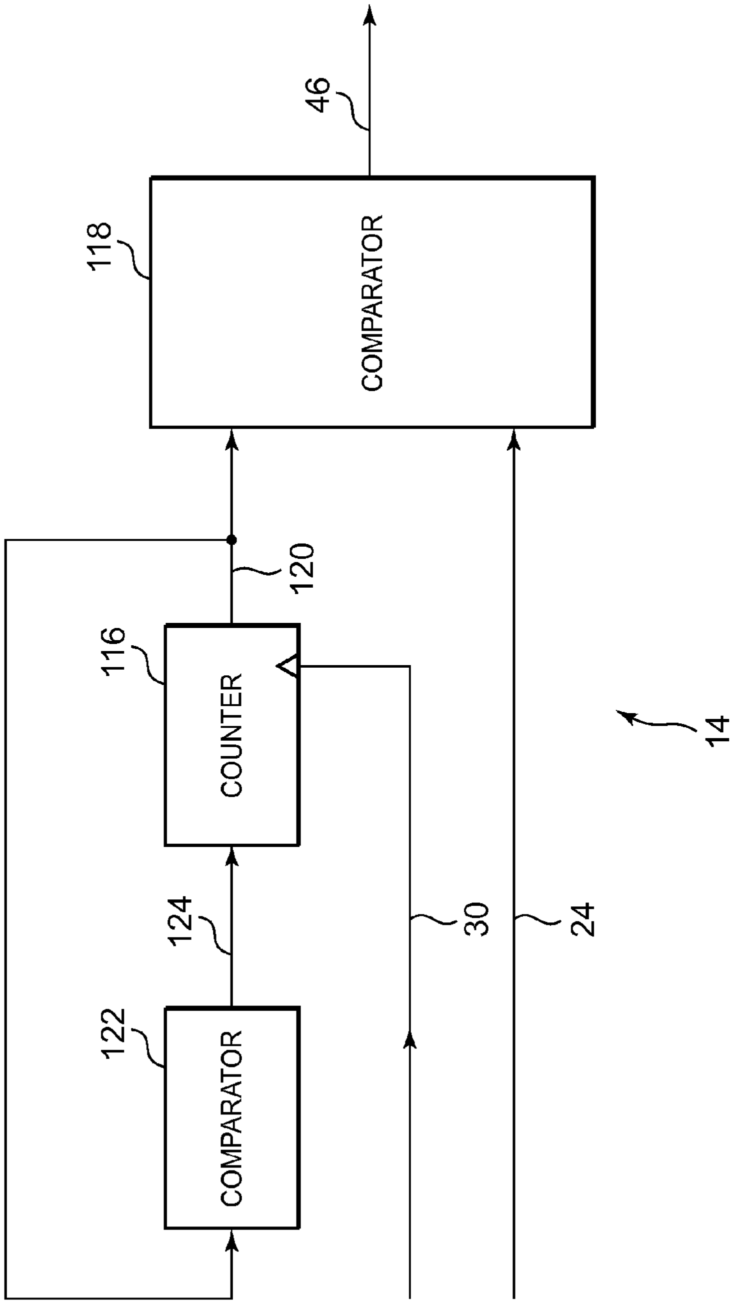
FIG. 8 is a block diagram showing a schematic configuration of a further configuration example of the data generation unit (PDM) shown in FIG. 1.

A third preferred embodiment illustrative of a D/A converter 10 to which an analog signal generator according to the present invention is applied will further be explained. As shown in FIG. 8, a data generation unit 14 according to the present embodiment includes a counter 116, a comparator 118 and a comparator 122 with a subtraction function and realizes or achieves a PDM function. The data generation unit 14 according to the present embodiment is characterized in that the comparator 122 is added to the components shown in FIG. 6. The counter 116 employed in the present embodiment has three initial value set functions. The counter 116 increments a count value 120 (COUNTER1) by +3 every rising edge of a clock signal 30 (COUNTER1=COUNTER1+3) and outputs the same to the comparator 118 and the comparator 122.

The comparator 122 has the function of subtracting the maximum value of the counter 116 from the count value 120 and has the function of setting an output count value of the counter 116 according to the obtained subtracted value. The comparator 122 outputs a set value 124 corresponding to a case in which the obtained subtracted value is less than or equal to "0", "−1", "−2" and "2", to the counter 116. Described specifically, when the obtained subtracted value is "0", "−1" and "−2" in particular, the comparator 122 outputs and sets the value of a subtracted value −1 corresponding to the following conditional expression (5) without resetting the counter 116.

$$\text{IF(COUNTER1)>2\^{}}(X{+}1){-}1)\text{COUNTER1}=(\text{COUNTER1}{+}3)\%(2\text{\^{}}(X{+}1)); \quad (5)$$

Thus, when the subtracted value is "0", the counter 116 sets "−1" and outputs a count value "2" by a +3 increment on the rising edge of the next clock signal 30. Similarly, when the subtracted value is "−1", the counter 116 outputs "1" on the rising edge of the next clock. When the subtracted value is "−2", the counter 116 outputs "2" on the rising edge of the next clock. When the subtracted value is less than or equal to "−2", the comparator 122 no sets the counter 116. At this time, the counter 116 outputs a count value 120 obtained by incrementing the count value by +3 simply.

The comparator 118 compares a value excepting an upper 1 bit of the supplied count value 120 and a fixed value 24 (FIX_DATA). When the value excepting the upper 1 bit of the count value 120 is less than or equal to the fixed value 24, the comparator 118 outputs data 46 of a value "1" (COMP1=1) as represented by the following conditional expression (6).

| | | |
|---|---|---|
| IF(COUNTER1[(X−1): 0] <= FIX_DATA) | COMP1 = 1; | (6) |
| ELSE | COMP1 = 0; | |

When the value excepting the upper 1 bit of the count value 120 is greater than the fixed value 24 in reverse, the comparator 118 outputs data 46 of a data 46 value "0" (COMP1=0).

A relationship between each output count value 120 of the counter 116 and the output of the comparator 118 will be disclosed. The data generation unit 14 makes use of a 5-bit (X=4) counter 116. A case indicative of the result of comparisons with a fixed value "3" at the comparator 118 is shown in FIG. 9. The output of the decimal notation counter 116 is represented in a section 126 of FIG. 9. A section 128 is displayed in binary notation or representation. A section 130 is represented by the values excepting the upper 1 bit of the count value 120. A section 132 is represented by the output of the comparator 118.

Incidentally, although the output value is set as each of the values excepting the upper 1 bit in the present embodiment, it is needless to say that it may be represented by changing each excepted upper bit according to each bit of a used counter.

Figure 10:
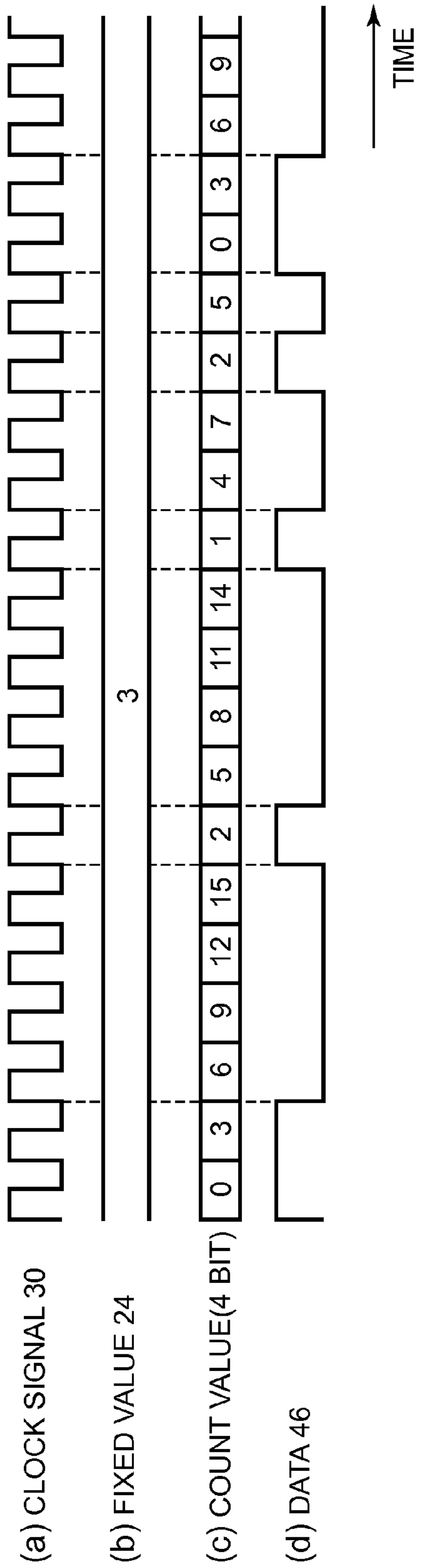
FIG. 10 is a timing chart which has disclosed the operation of the data generation unit (PDM) shown in FIG. 8.

The operation of the data generation unit 14 according to the present embodiment is shown in FIG. 10. A comparison is made between data (FIG. 10(*c*)) of the section 130 obtained based on data 120 supplied on the rising edge of a clock signal shown in FIG. 10(*a*) and a fixed value 24 shown in FIG. 10(*b*). FIG. 10(*d*) corresponds to data 46 and shows the condition of transition of the data contents of the above section 132 along the time series.

In a manner similar to the previous embodiment in the present embodiment, the data 46 of level "1" can be much more dispersed. Further, the frequency component can be made high by the dispersion and the time constant can be set to a smaller time constant. It is thus possible to cause the voltage level to reach a desired voltage level earlier.

While the preferred forms of the present invention have been described, it is to be understood that modifications will be apparent to those skilled in the art without departing from the spirit of the invention. The scope of the invention is to be determined solely by the following claims.

What is claimed is:

1. An analog signal generator comprising:

first data generating means for generating data within a predetermined cycle according to a first clock signal supplied thereto;

second data generating means for generating data within a variable cycle according to a second clock signal supplied thereto;

switching means for temporarily holding the data outputted from the first and second data generating means and switching ON/OFF of the output of the data held therein;

selecting means for decoding control signals supplied thereto, generating selection signals for performing switching of ON/OFF and outputting the same to the switching means;

control means for supplying a predetermined value to the first and second data generating means, generating the control signals for the selecting means and supplying the same to the selecting means; and analog generating means for generating an analog signal by filtering, based on the data supplied via the switching means.

2. The analog signal generator according to claim 1, wherein the first data generating means includes:

adding means for adding the data, and data storing means for temporarily holding the output of the adding means according to the first clock signal and outputting the most significant bit of the held data, and wherein the adding means inputs a fixed value on the one end side, inputs data represented in bits excepting the most significant bit on the other end side, and adds and outputs the data.

3. The analog signal generator according to claim 1, wherein the first data generating means includes:

counting means for performing counting according to the first clock signal and outputting the counted value, and comparing means for inputting the counted value and the fixed value therein, exchanging all bits indicative of the counted value symmetrically with respect to a bit center, outputting data "1" when the exchanged values are less than or equal to the fixed value, and outputting data 0 when other than the above.

4. The analog signal generator according to claim 1, wherein the first data generating means includes:

counting means for counting a predetermined value according to the first clock signal as an increment and outputting a counted value, subtraction function-added comparing means for subtracting a maximum value of the counting means from the counted value, prohibiting a value obtained by the subtraction from being outputted as a set value when the value obtained by the subtraction is less than or equal to a predetermined subtracted value, and outputting a value greater than the predetermined subtracted value as a set value, and comparing means for inputting the counted value and the fixed value therein, comparing a comparison value represented except for a predetermined upper bit in bits expressed by the counted value, and the fixed value, outputting data "1" when the comparison value is less than or equal to the fixed value, and outputting data "0" when other than the above.

5. The analog signal generator according to claim 1, wherein the analog generating means includes a plurality of filtering filter means.

* * * * *